United States Patent
Dorfman et al.

(10) Patent No.: US 8,692,131 B2
(45) Date of Patent: Apr. 8, 2014

(54) THERMOFORMABLE POLYMER THICK FILM SILVER CONDUCTOR AND ITS USE IN CAPACITIVE SWITCH CIRCUITS

(71) Applicant: E I du Pont de Nemours and Company, Wilmington, DE (US)

(72) Inventors: Jay Robert Dorfman, Durham, NC (US); Vincenzo Arancio, Bristol (GB)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 14/050,525

(22) Filed: Oct. 10, 2013

(65) Prior Publication Data

US 2014/0037941 A1    Feb. 6, 2014

Related U.S. Application Data

(60) Continuation-in-part of application No. 13/851,171, filed on Mar. 27, 2013, now abandoned, which is a division of application No. 13/471,950, filed on May 15, 2012, now abandoned, which is a continuation-in-part of application No. 13/236,959, filed on Sep. 20, 2011, now abandoned.

(51) Int. Cl.
  *G06F 3/044* (2006.01)
  *H03K 17/975* (2006.01)
  *H01B 1/22* (2006.01)

(52) U.S. Cl.
  USPC ............................ 174/257; 345/173; 252/514

(58) Field of Classification Search
  CPC ........... H01B 1/22; G06F 3/044; G06F 3/045; H05K 1/162; H03K 17/962; H03K 17/975; H01G 4/33; H01H 1/029; H01H 13/702
  USPC .................. 252/514; 174/257; 345/173, 174; 200/600; 361/763
  See application file for complete search history.

(56) References Cited

U.S. PATENT DOCUMENTS

| 5,089,173 A | 2/1992 | Frentzel | |
| 5,653,918 A * | 8/1997 | Towlson | 252/514 |
| 2008/0309638 A1 * | 12/2008 | Tatehata | 345/173 |
| 2009/0169724 A1 * | 7/2009 | Ogiwara | 427/77 |

OTHER PUBLICATIONS

Dziedzic "Polymer/conductive filler composites . . . ", SPIE vol. 2780, Apr. 1996, pp. 18-24.*
PCT Search Report, Feb. 6, 2013.

* cited by examiner

*Primary Examiner* — Mark Kopec

(57) ABSTRACT

This invention is directed to a polymer thick film conductive composition that may be used in applications where thermoforming of the base substrate occurs, e.g., as in capacitive switches. Polycarbonate substrates are often used as the substrate and the polymer thick film conductive composition may be used without any barrier layer. Thermoformable electric circuits benefit from the presence of an encapsulant layer over the dried polymer thick film conductive composition. The electrical circuit is subsequently subjected to an injection molding process.

16 Claims, No Drawings

THERMOFORMABLE POLYMER THICK FILM SILVER CONDUCTOR AND ITS USE IN CAPACITIVE SWITCH CIRCUITS

This application is a CIP of Ser. No. 13/471,950 (filed May 12, 2012, now ABN), which application is a CIP of Ser. No. 13/236,959 (filed Sep. 20, 2011, now ABN).

FIELD OF THE INVENTION

This invention is directed to a polymer thick film conductive composition that may be used in applications where thermoforming of the base substrate occurs. Polycarbonate substrates are often used and the silver conductor may be used without any barrier layer.

BACKGROUND OF THE INVENTION

Conductive PTF circuits have long been used as electrical elements. Although they have been used for years in these types of applications, the use of PTF silver conductors in thermoforming procedures is not common. This is particularly important in circuits where a highly conductive silver composition is needed after the severe thermoforming process. Additionally, the typical substrate used for thermoforming is polycarbonate and very often the silver is not compatible with this substrate. One of the purposes of this invention is to alleviate these issues and produce a conductive, thermoformable construction in which the printed silver conductor can be used on a substrate of choice such as a polycarbonate.

SUMMARY OF THE INVENTION

This invention relates to a polymer thick film conductive composition comprising:
(a) 30-70 wt % silver;
(b) 10-40 wt % first organic medium comprising 10-50 wt % thermoplastic urethane resin dissolved in a first organic solvent, wherein the weight percent of the thermoplastic urethane resin is based on the total weight of the first organic medium; and
(c) 10-40 wt % second organic medium comprising 10-50 wt % thermoplastic polyhydroxyether resin dissolved in an organic solvent wherein the weight percent of the thermoplastic polyhydroxyether resin is based on the total weight of the second organic medium;
wherein the weight percent of the silver, the first organic medium and the second organic medium are based on the total weight of the polymer thick film conductive composition.

In an embodiment, the polymer thick film conductive composition further comprises:
(d) 1-20 wt % of a third organic solvent, wherein the third organic solvent is diacetone alcohol and wherein the weight percent is based on the total weight of the polymer thick film conductive composition.

In one embodiment, the silver is in the form of silver flakes.

The invention is further directed to using the thermoformable conductive composition to form conductive electrical circuits for capacitive switches and, in particular, in the thermoforming of the total construction. In one embodiment an encapsulant layer is deposited over the dried PTF silver composition.

DETAILED DESCRIPTION OF INVENTION

The invention relates to a polymer thick conductive composition for use in thermoforming electrical circuits and, in particular, capacitive switch circuits. A layer of conductor is printed and dried on a substrate so as to produce a functioning circuit and then the entire circuit is subjected to pressure and heat that deforms the circuit to its desired three dimensional characteristics, i.e., thermoforming.

The substrates commonly used in polymer thick film thermoformed circuits are polycarbonate (PC), PVC and others. PC is generally preferred since it can be thermoformed at higher temperatures. However, PC is very sensitive to the solvents used in the layers deposited on it.

The polymer thick film (PTF) conductive composition is comprised of (i) silver, (ii) a first organic medium comprising a first polymer resin dissolved in a first organic solvent and (iii) a second organic medium containing a second polymer resin dissolved in a second organic solvent.

In an embodiment that results in no crazing or deformation of the underlying substrate onto which the PTF conductive composition is printed, the PTF conductive composition further comprises a third solvent, diacetone alcohol.

Additionally, powders and printing aids may be added to improve the composition.

Each constituent of the electrically conductive composition of the present invention is discussed in detail below.

A. Conductive Silver Powder

The silver in the present thick film composition are Ag conductor powders and may comprise Ag metal powder, alloys of Ag metal powder, or mixtures thereof. Various particle diameters and shapes of the metal powder are contemplated. In an embodiment, the conductive powder may include any shape silver powder, including spherical particles, flakes (rods, cones, plates), and mixtures thereof. In one embodiment, the silver is in the form of silver flakes.

In an embodiment, the particle size distribution of the silver powders is 1 to 100 microns; in a further embodiment, 2-10 microns.

In an embodiment, the surface area/weight ratio of the silver particles is in the range of 0.1-1.0 $m^2/g$.

Furthermore, it is known that small amounts of other metals may be added to silver conductor compositions to improve the properties of the conductor. Some examples of such metals include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

In one embodiment, the silver flakes are present at 30 to 70 wt %, based on the total weight of the PTF conductive composition. In another embodiment, the silver flakes are present at 40 to 70 wt % and in still another embodiment, the silver flakes are present at 48 to 58 wt %, again based on the total weight of the PTF conductive composition.

B. Organic Media

The first organic medium is comprised of a thermoplastic urethane resin dissolved in a first organic solvent. The urethane resin must achieve good adhesion to the underlying substrate. It must be compatible with and not adversely affect the performance of the circuit after thermoforming.

In one embodiment the thermoplastic urethane resin is 10-50 wt % of the total weight of the first organic medium. In another embodiment the thermoplastic urethane resin is 15-45 wt % of the total weight of the first organic medium and in still another embodiment the thermoplastic urethane resin is 15-25 wt % of the total weight of the first organic medium.

In one embodiment the thermoplastic urethane resin is a urethane homopolymer. In another embodiment the thermoplastic urethane resin is a polyester-based copolymer.

The second organic medium is comprised of a thermoplastic polyhydroxyether resin dissolved in a second organic solvent. It should be noted that the same solvent that is used in the first organic medium can be used in the second organic medium or a different solvent could be used. The solvent must be compatible with and not adversely affect the performance of the circuit after thermoforming. In one embodiment the thermoplastic polyhydroxyether resin is 10-50 wt % of the total weight of the second organic medium. In another embodiment the thermoplastic polyhydroxyether resin is 15-45 wt % of the total weight of the second organic medium and in still another embodiment the thermoplastic resin is 20-30 wt % of the total weight of the second organic medium.

The polymer resin is typically added to the organic solvent by mechanical mixing to form the medium. Solvents suitable for use in the organic media of the polymer thick film conductive composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points (in the range of 180° C. to 250° C.), and mixtures thereof may be used. Various combinations of these and other solvents are formulated to obtain the viscosity and volatility requirements desired. The solvents used must solubilize the resin.

Third Organic Solvent

In one embodiment, the conductive composition further comprises a third organic solvent, diacetone alcohol. In an embodiment the diacetone alcohol is 1-20 wt % of the total weight of the PTF conductive composition. In another embodiment the diacetone alcohol is 3-12 wt % of the total weight of the PTF conductive composition and in still another embodiment the diacetone alcohol is 4-6 wt % of the total weight of the PTF conductive composition.

Additional Powders

Various powders may be added to the PTF conductor composition to improve adhesion, modify the rheology and increase the low shear viscosity thereby improving the printability.

Application of the PTF Conductor Composition

The PTF conductor, also referred to as a "paste", is typically deposited on a substrate, such as polycarbonate, that is impermeable to gases and moisture. The substrate can also be a sheet of a composite material made up of a combination of plastic sheet with optional metallic or dielectric layers deposited thereupon.

The deposition of the PTF conductor composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

The PTF conductor composition is processed for a time and at a temperature necessary to remove all solvent. For example, the deposited thick film is dried by exposure to heat at 140° C. for typically 10-15 min.

Circuit Construction

The base substrate used is typically 10 mil thick polycarbonate. The conductor composition is printed and dried as per the conditions described above. Several layers can be printed and dried. Subsequent steps which may include thermoforming (190° C., 750 psi) of the entire unit as is typical in the production of 3D capacitive switch circuits. In one embodiment, an encapsulant layer is deposited over the dried PTF silver composition and then, dried. The encapsulant is comprised of the same organic mediums as contained in the PTF silver composition, i.e., the same polymers in the same ratios as present in the PTF silver composition.

It has been found that use of this encapsulant improves the yield (i.e. decreases the failure rate) of thermoformed circuits.

In the course of producing a 3-dimensional capacitive circuit, after the thermoforming step, the final step will often be a molding step in which the finished circuit is formed by injection molding using a resin such as polycarbonate. This process is referred to as in-molding and involves higher temperatures. Depending on the resin chosen, these temperatures can typically exceed 250° C. for 10-30 sec. Thus the choice of the resins used in the PTF composition is critical. The combination of the resins used in the instant PTF composition has been shown to survive the in-mold process and produce fully functional circuitry whereas most resins typically used in PTF compositions will not.

EXAMPLES, COMPARATIVE EXPERIMENTS

Example 1

The PTF conductor composition was prepared in the following manner. 20.50 wt % of the first organic medium was used and was prepared by mixing 20.0 wt % Desmocoll 540 polyurethane (Bayer MaterialScience LLC, Pittsburgh, Pa.) with 80.0 wt % dibasic esters (obtained from DuPont Co., Wilmington, Del.) organic solvent. The molecular weight of the resin was approximately 20,000. This mixture was heated at 90° C. for 1-2 hours to dissolve all the resin. 53.75 wt % of a flake silver powder with an average particle size of approximately 5 microns was added to the first organic medium. A printing additive (0.25 wt %) was also added. Finally, 25.5 wt % of a second organic medium was prepared by mixing and heating as described above 27.0% of polyhydroxyether resin PKHH (Phenoxy Associates, Rock Hill, S.C.) with 73.0% dibasic esters (obtained from DuPont Co., Wilmington, Del.) and then was added to the first organic medium, flake silver powder and printing additive mixture.

The wt % of the first organic medium, the flake silver powder, the printing additive and the second organic medium were based upon the total weight of the composition.

This composition was mixed for 30 minutes on a planetary mixer, and then subjected to several passes on the three roll-mill.

A circuit was then fabricated as follows. On a 10 mil thick polycarbonate substrate, a pattern of a series of interdigitated silver lines were printed using a 280 mesh stainless steel screen. The patterned lines were dried at 120° C. for 15 min in a forced air box oven. The part was inspected and minimal crazing or deformation of the underlying substrate was found.

After thermoforming at 190° C., the conductive lines remained conductive and were well adhered to the substrate.

Comparative Experiment 1

A circuit was produced exactly as described in Example 1. The only difference was that the second organic medium was not used. Inspection of the substrate showed that the silver composition showed minimal crazing and deformation of the underlying polycarbonate substrate. The conductive traces remained conductive after thermoforming as well although the overall quality of the traces was somewhat reduced.

Comparative Experiment 2

A circuit was produced exactly as described in Example 1. The only difference was that the conductive composition used contained 63.0 wt % silver flake and a polyester resin in place of the urethane and polyhydroxyether resins. After thermoforming, the conductor lines were no longer conductive and did not adhere well to the substrate.

Example 2

A circuit was produced exactly as described in Example 1. The only difference was that 5 wt % of diacetone alcohol was added to the conductive composition of claim 1.

Inspection of the substrate showed that the silver composition showed no crazing or deformation of the underlying polycarbonate substrate. A definite improvement from Comparative Experiments 1 and 2 could be seen. There was also improvement over the minimal crazing or deformation of the underlying substrate found in Example 1.

The use of the urethane and polyhydroxyether resins clearly show strikingly good results after thermoforming. Replacement with a different resin type i.e., polyester, renders the composition non-conductive after thermoforming. The additional improvement in resistance to crazing as a result of the presence of diacetone alcohol solvent is also apparent from the results shown above in Example 2.

Example 3

A circuit was produced exactly as described in Example 2. In addition, an encapsulant layer comprised of the same organic mediums as present in the PTF conductive composition of Example 2 was printed over the dried PTF conductive composition. The encapsulant was printed in a test pattern such that portions of the dried PTF conductive composition were covered by the encapsulant layer and other portions were not covered. The purpose was to determine the relative yield loss due to severe cracking after harsh thermoforming. Thermoforming was then carried out. The portions with the encapsulant had approximately 20% fewer failures than the portions without encapsulant. It is dear that use of the encapsulant improves thermoforming performance of the underlying silver conductor.

What is claimed is:
1. A capacitive switch circuit comprising a dried encapsulant layer covering a dried polymer thick film conductive composition, said polymer thick film conductive composition comprising
    (a) 30-70 wt % silver;
    (b) 10-40 wt % first organic medium comprising 110-50 wt % thermoplastic urethane resin dissolved in a first organic solvent, wherein the weight percent of the thermoplastic urethane resin is based on the total weight of the first organic medium; and
    (c) 10-40 wt % second organic medium comprising 10-50 wt. % thermoplastic polyhydroxyether resin dissolved in a second organic solvent wherein the weight percent of the thermoplastic polyhydroxyether resin is based on the total weight of the second organic medium;
wherein the weight percent of said silver, said first organic medium and said second organic medium are based on the total weight of said polymer thick film conductive composition and wherein said polymer thick film conductive composition is dried before said encapsulant layer comprising the same polymers in the same ratios as present in said polymer thick film conductive composition is deposited and dried.
2. The capacitive switch circuit of claim 1, said polymer thick film conductive composition further comprising
    (d) 1-20 wt % of a third organic solvent, wherein the third organic solvent is diacetone alcohol and wherein the weight percent is based on the total weight of said polymer thick film conductive composition.
3. The capacitive switch circuit of claim 2, wherein said capacitive switch circuit is thermoformed.
4. The capacitive switch circuit of claim 3, wherein said capacitive switch circuit has been subsequently subjected to an injection molding process.
5. The capacitive switch circuit of claim 1, wherein said silver is in the form of silver flakes.
6. The capacitive switch circuit of claim 1, wherein said thermoplastic urethane resin is a urethane homopolymer or a polyester-based copolymer.
7. The capacitive switch circuit of claim 1, wherein said capacitive switch circuit is thermoformed.
8. The capacitive switch circuit of claim 7, wherein said capacitive switch circuit has been subsequently subjected to an injection molding process.
9. An electrical circuit comprising a conductor formed from a dried polymer thick film conductive composition with a dried encapsulant layer over said dried polymer thick film conductive composition,
    said polymer thick film conductive composition comprising:
        (a) 30-70 wt % silver;
        (b) 10-40 wt % first organic medium comprising 10-50 wt % thermoplastic urethane resin dissolved in a first organic solvent, wherein the weight percent of the thermoplastic urethane resin is based on the total weight of the first organic medium; and
        (c) 10-40 wt % second organic medium comprising 10-50 wt % thermoplastic polyhydroxyether resin dissolved in a second organic solvent wherein the weight percent of the thermoplastic polyhydroxyether resin is based on the total weight of the second organic medium;
    wherein the weight percent of said silver, said first organic medium and said second organic medium are based on the total weight of said polymer thick film conductive composition, wherein said polymer thick film conductive composition is dried before said encapsulant layer comprising the same polymers in the same ratios as present in said polymer thick film conductive composition is deposited and dried, and wherein said electrical circuit is thermoformed.
10. The electrical circuit of claim 9, said polymer thick film conductive composition further comprising
    (d) 1-20 wt % of a third organic solvent, wherein the third organic solvent is diacetone alcohol and wherein the weight percent is based on the total weight of said polymer thick film conductive composition.

11. The electrical circuit of claim 10, wherein said electrical circuit has been subsequently subjected to an injection molding process.

12. The electrical circuit of claim 9, wherein said silver is in the form of silver flakes.

13. The electrical circuit of claim 12, wherein said electrical circuit has been subsequently subjected to an injection molding process.

14. The electrical circuit of claim 9, wherein said thermoplastic urethane resin is a urethane homopolymer or a polyester-based copolymer.

15. The electrical circuit of claim 14, wherein said electrical circuit has been subsequently subjected to an injection molding process.

16. The electrical circuit of claim 9, wherein said electrical circuit has been subsequently subjected to an injection molding process.

* * * * *

UNITED STATES PATENT AND TRADEMARK OFFICE
CERTIFICATE OF CORRECTION

PATENT NO.       : 8,692,131 B2
APPLICATION NO.  : 14/050525
DATED            : April 8, 2014
INVENTOR(S)      : Dorfman Page 1 of 1

It is certified that error appears in the above-identified patent and that said Letters Patent is hereby corrected as shown below:

In the Claim

Column 5, Claim 1, line 65, please change "110-50 wt" to read -- 10-50 wt --.

Signed and Sealed this
Twenty-fourth Day of June, 2014

Michelle K. Lee
*Deputy Director of the United States Patent and Trademark Office*